(12) United States Patent
Koehler et al.

(10) Patent No.: US 11,137,464 B2
(45) Date of Patent: Oct. 5, 2021

(54) METHOD AND APPARATUS FOR ACQUIRING MAGNETIC RESONANCE DATA

(71) Applicant: Siemens Healthcare GmbH, Erlangen (DE)

(72) Inventors: Michael Koehler, Nuremberg (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 498 days.

(21) Appl. No.: 15/878,891

(22) Filed: Jan. 24, 2018

(65) Prior Publication Data

US 2018/0210056 A1    Jul. 26, 2018

(30) Foreign Application Priority Data

Jan. 24, 2017   (DE) .......................... 102017201074.6

(51) Int. Cl.
*G01R 33/56* (2006.01)
*G01R 33/565* (2006.01)
*G01R 33/24* (2006.01)

(52) U.S. Cl.
CPC ... *G01R 33/5607* (2013.01); *G01R 33/56527* (2013.01); *G01R 33/243* (2013.01); *G01R 33/56536* (2013.01)

(58) Field of Classification Search
CPC .......... G01R 33/5607; G01R 33/56527; G01R 33/56536; G01R 33/243
See application file for complete search history.

(56) References Cited

U.S. PATENT DOCUMENTS

| 4,806,866 A * | 2/1989 | Maier ................ G01R 33/4833 324/313 |
| 2003/0210044 A1 * | 11/2003 | Hwang .............. G01R 33/5613 324/307 |

(Continued)

OTHER PUBLICATIONS

Hauger, et. al.; "Water Excitation as an Alternative to Fat Saturation in MR Imaging: Preliminary Results in Musculoskeletal ImagingI"; Radiology; vol. 224; No. 3; pp. 657-663 (2002).

(Continued)

*Primary Examiner* — Patrick Assouad
*Assistant Examiner* — Haidong Zhang
(74) *Attorney, Agent, or Firm* — Schiff Hardin LLP

(57) ABSTRACT

In a method and magnetic resonance (MR) apparatus for acquiring MR data from a volume of an object in which first and second excitable spin types are present that differ in their Larmor frequencies by a chemical shift, an MR sequence with at least one radio-frequency pulse sequence selectively excites the first spin type or selectively suppresses MR signals of the second spin type. A B0 map describing the basic field distribution in a region of interest of the volume is established. First and second items of distribution information, which respectively describe the spectral distribution of Larmor frequencies of the first and second spin types, are derived from the B0 map. A pulse sequence parameter that describes the excitation spectrum of the radio-frequency pulse sequence is optimized based on the items of distribution information, with regard to a quality criterion that optimizes selective excitation and/or suppression.

20 Claims, 2 Drawing Sheets

(56) References Cited

U.S. PATENT DOCUMENTS

| | | | |
|---|---|---|---|
| 2008/0287773 A1* | 11/2008 | Harvey | G01R 33/4804 600/412 |
| 2012/0105060 A1* | 5/2012 | Boulant | G01R 33/4828 324/309 |
| 2013/0214785 A1* | 8/2013 | Shirai | G01R 33/4828 324/322 |
| 2013/0249554 A1 | 9/2013 | Simonetti et al. | |
| 2015/0204955 A1 | 7/2015 | Gumbrecht et al. | |

OTHER PUBLICATIONS

Yu, et al. "Robust Multipoint Water-Fat Separation Using Fat Likelihood Analysis" Magnetic Resonance in Medicine, vol. 67, No. 4, pp. 1065-1076, (2012).

* cited by examiner

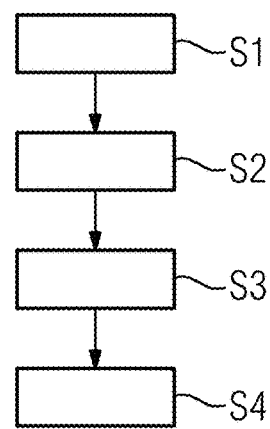
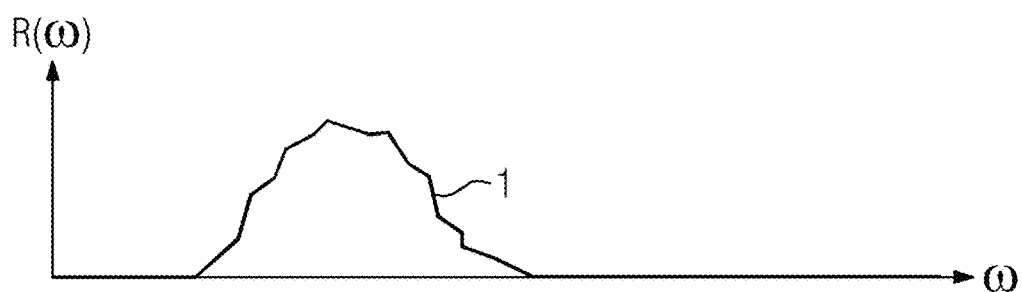
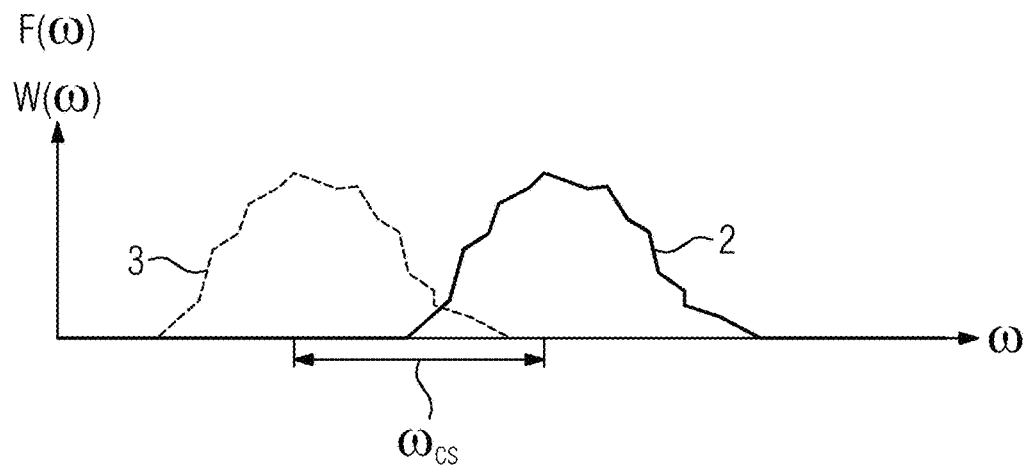

METHOD AND APPARATUS FOR ACQUIRING MAGNETIC RESONANCE DATA

BACKGROUND OF THE INVENTION

Field of the Invention

The invention concerns a method for acquiring magnetic resonance (MR) data with a magnetic resonance device in an acquisition volume of an object under examination, in which a first excitable spin type and a second excitable spin type are present which differ in their Larmor frequencies by a chemical shift, a magnetic resonance sequence with at least one radio-frequency pulse sequence being used for selectively exciting the first spin type or for selectively suppressing magnetic resonance signals of the second spin type. The invention also concerns a magnetic resonance apparatus and a non-transitory, electronically readable data storage medium for implementing such a method.

Description of the Prior Art

In magnetic resonance imaging, the object under examination, frequently a patient, is introduced into a strong magnetic field, whereupon nuclear spins in the object are excited by an excitation pulse. Decay of this excitation gives rise to magnetic resonance signals, therefore magnetic resonance data, which may be used to form images in medical technology. There are numerous imaging techniques and diagnostic questions in which specific spin types (spin species) or their signal contributions are intended to be suppressed, both in magnetic resonance imaging and in magnetic resonance spectroscopy. This is because when a nucleus is located in a chemical compound and a specific binding state is thus present, the other electron clouds in the vicinity of the nucleus generate an additional magnetic field, which brings about a characteristic shift in the Larmor frequency. This shift is known as the chemical shift. For example, the nuclei of hydrogen atoms (protons) bound to fat and water molecules have different resonant frequencies (Larmor frequencies) due to the binding conditions. The chemical shift distinguishes the spin types, in the example spins of fat-bound protons or spins of water-bound protons. For the majority of fat protons, the chemical shift is approx. 3.3 ppm, i.e. approx. 440 Hz at 3 tesla, and approx. 220 Hz at 1.5 tesla.

Various imaging techniques, particularly in the field of medical technology, make use of the chemical shifts in Larmor frequencies for purposefully manipulating image contrast. Accordingly in medical imaging, for example, the signal contributions of fat-bound protons are frequently intentionally suppressed so as to differentiate anatomical structures and disease processes. A number of suppression techniques for signals of specific spin types, each having individual advantages and disadvantages, are known in the prior art. One category of these suppression techniques relates to those that make use of a radio-frequency pulse sequence either selectively to excite the first spin type to be displayed, or selectively to suppress the second spin type, which is not to be displayed.

A first variant is known as spectrally selective suppression, in which a dedicated, spectrally selective radio-frequency excitation pulse tilts the longitudinal magnetization of the spin type to be suppressed into the transverse plane where it is dephased as completely as possible by spoiler gradients (dephasing gradients). An immediately subsequent radio-frequency excitation pulse, for example slice or volume excitation for 2D or 3D imaging, thus acquires only signal components of the unsuppressed spin type, such that for example when fat is suppressed it is substantially water which contributes to the image signal.

Spectrally selective excitation (in particular water excitation) is known in the prior art. A specific radio-frequency pulse sequence, which can be made acquisition volume-specific so as to excite only the spins of the spin type that is not to be suppressed, is used for this purpose. This exploits the phenomenon that, once excited, spins undergo a different phase evolution over time in the event of a chemical shift. This means, in turn, that excitation pulses output at later instants have a different effect on the different spin types. If the times at which the various radio-frequency pulses of the radio-frequency pulse sequence are emitted, and their excitation strengths (flip angles) are appropriately selected, it can be ensured that the spins of the spin type to be suppressed are again oriented longitudinally and therefore in the direction of the main field (flip angle=0) at the end of the radio-frequency pulse sequence, while the spins of the spin type to be acquired are deflected by a desired flip angle, and therefore excited.

Spectrally selective excitation conventionally makes use of "binomial pulse sequences" (or binomial pulses for short). These are radio-frequency pulse sequences assembled from a number of radio-frequency pulses with periodic "pass bands" and "stop bands" in the frequency space, in which a spectral pass band is set at the frequency of the spin type to be acquired (for example water spins) and a spectral stop band at the frequency of the spin type to be suppressed (for example fat spins). Binomial pulse sequences are families of assembled radio-frequency pulses, the relative flip angle ratio of which corresponds to the binomial coefficient, for example 1-1, 1-2-1, 1-3-3-1, 1-4-6-4-1, etc. Between pairs of these individual excitation pulses, there is an evolution time T, in which a relative phase angle of 180° ($\pi$) ideally develops between the first spin type which is to be acquired and the second spin type which is to be suppressed. If water and fat protons are considered at a field strength of 3 tesla, T approximately amounts to $\pi/(2\pi*440\ Hz)=1.1$ ms.

As an example, with regard to spectrally selective excitation, specifically water excitation, the article by O. Hauger et al., "Water Excitation as an Alternative to Fat Saturation in MR Imaging: Preliminary Results in Musculoskeletal Imaging", Radiology 2002 (224), pages 657-663 provides further background information.

One difficulty with spectral excitation or suppression methods is that spatial variations in the basic magnetic field (B0 field), i.e. basic field nonuniformities, which can occur due to differences in magnetic susceptibility in the object under examination or due to characteristics of the magnetic resonance scanner, also cause a variation in the Larmor frequency. In spatial zones in which the B0 field is increased for example by 3.3 ppm, a spectrally selective excitation pulse sequence for water, thus water excitation, will no longer visualize water spins, but instead fat spins. Similarly, in spatial zones in which the B0 field is reduced for example by 3.3 ppm, a spectrally selective saturation module, for example a suppression pulse sequence for fat, will no longer saturate fat spins, but instead water spins.

Achieving maximally optimal, i.e. spatially uniform, spectral excitation/saturation for spectrally selective excitation or suppression thus generally entails a maximally uniform B0 field amplitude in all water signal ranges, a maximally uniform B0 field amplitude in all fat signals ranges, and an appropriately selected spectrum of the radio-frequency pulse sequence.

The prior art makes use of predefined radio-frequency pulse sequences for spectrally selective suppression or excitation. Adapting the spectral shape of the radio-frequency pulse sequence to the basic field strength has already been proposed. At higher field strengths, shorter radio-frequency pulses with a broader excitation spectrum are used in order to take account of the field-dependent absolute value of the chemical shift. Heuristic adaptations of the spectral pulse shape of the radio-frequency pulses are furthermore known. Depending on the application/body region, the center frequency of the excitation or suppression pulse may be selected to differ from the theoretically expected value (for example 2.8 ppm instead of 3.3 ppm) in order to counter the "typically" prevailing local main field nonuniformities, for example main field nonuniformities due to anatomical characteristics.

It is furthermore known to adapt the radio-frequency pulse sequence to the actually prevailing ambient conditions by using a rapid projection method for the current acquisition volume in order to establish an average B0 field strength from which a center frequency of the radio-frequency pulses can then be derived.

SUMMARY OF THE INVENTION

An object of the present invention is to provide a way to achieve more uniform spectral excitation or suppression in an acquisition volume, in the acquisition of MR data.

This object is achieved by a method of the initially described type wherein, in accordance with the invention, a B0 map is produced in a computer, which describes the basic field distribution at least in a region of interest of the acquisition volume, and wherein a first item of distribution information, which describes the spectral distribution of Larmor frequencies of the first spin type, and a second item of distribution information, which describes the spectral distribution of Larmor frequencies of the second spin type, are derived in the computer from the B0 map. Further in accordance with the invention, at least one pulse sequence parameter, which describes the excitation spectrum of the radio-frequency pulse sequence, is optimized in the computer, dependent on the two items of distribution information, with regard to at least one quality criterion that optimizes selective excitation and/or suppression. The optimized radio-frequency pulse sequence is then emitted from the computer in electronic form as part of an electronic control sequence with a format for operating the magnetic resonance apparatus (i.e., the scanner thereof) in which the basic field distribution exists.

The present invention therefore exploits knowledge of the actual spatial distribution of the absolute B0 field in the current acquisition volume in order to optimize the spectral shape and location of radio-frequency excitation and suppression pulses on a situational basis. The invention here makes use of the development in recent years of measurement and evaluation methods with which the spatial distribution of the main field (B0 field) in a patient can be measured rapidly and with high precision. The outcome from such a method is usually a highly accurate B0 map, B0(x,y,z), which contains the absolute local magnetic field or the absolute deviation from a mean, for example in (micro)tesla or as a resonant frequency (shift). One example method for establishing such a B0 map is described in DE 10 2014 201 207 A1.

Use is preferably made of a B0 map, as may for example be established in DE 10 2014 201 207 A1, which is based on a reference spin type (and thus on a reference binding state of the nucleus, in particular proton, to be measured) and thus indirectly or directly describes a Larmor frequency of the reference spin type at this location for each voxel. A B0 map is thus used which, at each location (each voxel), indicates the resonant frequency (Larmor frequency) of a reference binding state of the relevant nucleus (for example protons in the water molecule binding state) and not the Larmor frequency of the binding state actually prevailing there. Such a B0 map which is based on a reference binding state enables the straightforward generation of separate items of distribution information for both spin types because the chemical shift between these spin types is known. If a spatially resolved measurement of the binding state actually prevailing at the respective location, in particular thus at the respective voxel, were used, it would not be possible or would be possible only with greater difficulty to separate fat and water spectra, since it would not be known whether the Larmor frequency measured at a certain location, in particular for a specific voxel, deviated from a Larmor frequency measured elsewhere due to variations in the B0 field or due to a chemical shift. As noted above, it is furthermore preferred for the B0 map to contain Larmor frequencies (or deviations from a nominal Larmor frequency) which are assigned to voxels for the reference spin type.

The basic concept of the present invention is therefore as follows: using the B0 map, an item of distribution information, in particular a histogram, of the Larmor frequencies of the first spin type is established with spatial reference (by the B0 map and optionally further items of information, as will be described in greater detail below). An item of distribution information, in particular a histogram, corresponding to the second spin type is additionally determined. A pulse parameter of the radio-frequency pulse sequence is then optimized in relation thereto in order to be able to achieve suppression or excitation that is maximally uniform with regard to spin type.

In a preferred embodiment, pulse sequence parameters that describe the location and/or width and/or shape of the excitation spectrum may be used as the pulse sequence parameters. If, for example, a Gaussian radio-frequency pulse with a specific bandwidth and a specific center frequency is used for the purposes of suppressing magnetic resonance signals from fat-bound protons as the second spin type, the excitation spectrum can readily be determined from known interrelationships and location (center frequency) and/or shape (bandwidth) may be considered as pulse sequence parameters to be optimized. It should additionally be noted that the radio-frequency pulse sequence can generally also only contain one single radio-frequency pulse. If, for example for water excitation, a 1-2-1 binomial pulse sequence is used, pulse sequence parameters to be optimized which may be considered are the temporal spacing and relative phase of the individual radio-frequency pulses which lead to the spectral shape, i.e. the excitation spectrum, being shifted or stretched. Other pulse sequence parameters to be optimized are, of course, also conceivable.

A substantial advantage of the present invention is the automatic optimization, adapted to capture and anatomy, of spectral excitation or saturation without requiring heuristic assumptions.

In one particularly well known application, the first spin type may be spins from protons bound in water molecules and the second spin type spins from fat-bound protons; the present invention may, however, also be applied to other first and second spin types and also to other nuclei, for example 23 Na instead of 1H, which may in principle be considered for measurement. Accordingly, fat and silicone or water and silicone or even all three may for example be used to define the spin types; in addition, the method is applicable not only to proton imaging, but also to other nuclei in which chemical shift plays a role.

In an embodiment of the present invention, the quality criterion that is used is an extremization criterion that describes a minimum excitation or suppression of the spin type not to be excited or not to be suppressed and/or a maximum excitation or suppression of the spin type to be excited or to be suppressed, in particular when using both extremization criteria with a respective weighting. In another embodiment, at least one constraint is used, in particular a maximum permitted excitation or suppression of the spin type not to be excited or not to be suppressed, and/or a minimum desired excitation or suppression of the spin type to be excited or to be suppressed. An extremization criterion may thus be a minimization criterion or a maximization criterion. It is preferred in the present context for an extremization criterion, thus a maximization criterion or a minimization criterion, to be used for one spin type but for a boundary condition to be used for the other spin type. The quality criterion generally or the extremization criterion specifically may here, as is in principle known in the prior art, be described by a target function, wherein various criteria may be introduced into the target function with different weightings. Optimization methods known in principle in the prior art, for example gradient-based optimization algorithms and the like, may be used for the algorithmic implementation of optimization herein.

In a specific example of fat suppression (water excitation) the location of the excitation spectrum of the radio-frequency pulse sequence configured as a fat suppression pulse sequence (water excitation pulse sequence) is determined as a pulse sequence parameter, such that the fat signal is minimized and simultaneously, as a constraint, at least 95% of the water signal is retained.

It may here moreover generally be assumed that the distributions described by the item of distribution information will overlap and therefore a 100% separation would appear to be virtually impossible in practice.

Histograms are preferably established as items of distribution information. If the spatial distribution of the B0 field is known from the B0 map and if it is not yet possible or desired to differentiate between fat and water, a histogram $R(\omega)$ with a defined increment $\Delta\omega$, into which the Larmor frequency values for the various voxels from the B0 map are sorted, may first of all be generated. Such a histogram then indicates how frequently (or with what relevance, which will be addressed in greater detail below) a Larmor frequency is to be found in the range $[\omega, \omega+\Delta\omega]$ in the acquisition volume or in the region of interest. Instead of discrete histograms, it is also possible to use continuous distribution functions, for example by smoothing, as an item of distribution information.

In an embodiment of the present invention, the item of distribution information is established for one of the spin types, in particular if the B0 map is based on the spin type other than the reference spin type, by shifting the distribution of the Larmor frequencies of the other spin type by the chemical shift. If the relative chemical shift is known, an item of distribution information $R(\omega)$ determined from the B0 map is obtained which may then also be used correspondingly as an item of distribution information for the reference spin type by also spectrally shifting the item of distribution information for the respective other spin type. If, for example, water spins are considered as the first spin type and fat spins as the second spin type, using the water spins as the reference spin type gives rise to $W(\omega)=R(\omega)$ and $F(\omega)=R(\omega-\omega_{cs})$, wherein $\omega_{cs}$ is the chemical shift. As has already been noted, depending on spatial field and tissue distribution, the items of distribution information, in particular histograms, will frequently overlap and therefore it is in principle not possible by spectrally selective excitation or suppression to excite all water spins and simultaneously to suppress all fat spins.

In an alternative, preferred embodiment of the present invention, in addition to the B0 map, a spin type distribution map, which assigns spin type proportions to voxels, is established at least for the region of interest of the acquisition volume, wherein a voxel of the B0 map contributes to at least one the items of distribution information as a function of the spin type proportions. Such a spin type distribution map may also be understood in the case of a patient (who is conventionally the object under examination) as a "tissue map" and therefore in general as $G(x,y,z)$. In this manner, it is known to assign voxels spatially to spin types, such that it may for example be provided that the spin type distribution map describes a dominant spin type for each voxel and/or relative proportions of the spin type in the voxel.

In a version of this embodiment, when the spatial spin type assignment is water as the first spin type and fat as the second spin type and $G(x,y,z) \in \{W, F\}$, is also known, masks are derived for the first spin type and the second spin type. Only the Larmor frequencies indicated by the corresponding mask are then added to the corresponding item of distribution information, for example the Larmor frequency in a voxel marked "W" is added only to the water item of distribution information and the Larmor frequency in a voxel marked "F" only to the fat item of distribution information. It should, however, be borne in mind, if the B0 field map is based on one of the spin types as the reference spin type, that the chemical shift for the item of distribution information of the second spin type should be applied to the corresponding Larmor frequencies (or the items of distribution information after complete determination).

In another embodiment, when relative proportions of spin type in the voxel are described by the spin type distribution map, a voxel contributes to the respective item of distribution information for the purpose of establishing the items of distribution information when the relative proportion of the respective spin type exceeds a threshold value. In this case, by using a threshold value, it is thus possible to exclude only those spatial positions (voxels) from contributing to the items of distribution information that contain virtually no spins of the first or second spin types. In this manner, the actual ratios will obtain distribution functions that provide a better representation.

Overall, in comparison with simple spectral shifting of a single item of distribution information, the embodiments that use a spin type distribution map are capable of producing items of distribution information, in particular histograms, of a different shape.

It should also be noted in this context that such a spin type distribution map can be established by analysis of a B0 map that was not initially acquired on the basis of the reference spin type, in particular to obtain for the first time a B0 map that is based on a reference spin type. For example, clusters may be formed on the basis of jumps in Larmor frequency values, wherein, for each cluster, a decision may be made on the basis of a smoothness criterion and a compactness criterion as to whether the cluster is one containing a majority of fat-bound protons. Such an approach is described for example, in the cited DE 10 2014 201 207 A1.

In another embodiment of the present invention, when establishing the items of distribution information, use is also made of a tissue mask that indicates, for each voxel, whether and/or how strongly it is taken into account when establishing the items of distribution information. Such a tissue mask may make a binary differentiation between "tissue"=1 and "surroundings" (air)=0 or indeed between "region of interest" and "region not of interest", or alternatively be present as a continuous weighting, for example in the range 0=unimportant region to 1=important region. In this manner, it is possible to exclude regions that are not acquired by imaging (for example outside the acquisition volume or within spatial saturation regions) when establishing the items of distribution information. For example, the tissue mask may also describe the actual region of interest within an object under examination, in particular a patient, and here be appropriately predefined by a user. Organs of particular interest in imaging may for example be provided with a high relevance and the like. In this manner, it is possible using a tissue mask to ensure that the optimization refers to the magnetic resonance data which are also really of interest, for example of diagnostic interest, and can thus be displayed in distinctly improved image quality.

The tissue mask may be established automatically and/or as a function of user input, in particular by segmentation of the boundaries of the object under examination and/or of an organ in the B0 map and/or in a previously acquired magnetic resonance data set of the object under examination, in particular an overview image data set and/or planning data set and/or localizer data set. While use may be made of user input, also for selection of the magnetic resonance sequence, for example as an organ program, in order to effectively define the tissue mask, a further option is also to evaluate the B0 map and/or a previously acquired magnetic resonance data set of the acquisition volume, for example of a localizer, in order to establish where (relevant) tissue is present and where only noise-containing surroundings (in particular air) are present. Reference may be made to organ segmentation and/or segmentation of the boundaries of the object under examination, in the form of a patient.

For the purposes of the present invention, it is also possible for a number of second spin types to be taken into account, in particular spins of protons bound in different types of fat. The method may therefore be extended to a number of spectral lines to be excited/suppressed. Fat-bound protons accordingly have different Larmor frequencies, for example depending on the binding state, which can be taken into account in the item of distribution information, preferably dependent on a known relative frequency. It is thus possible for items of distribution information for the various second spin types, and/or an item of distribution information for the entirety of second spin type to be derived for all the second spin types from an item of reference information established from the B0 map on the basis of a reference spin type. Using one of the previously described two alternatives, with or without a spin type distribution map, it is thus possible to initially determine an item of reference information based on all the second spin types from the B0 map, which item of reference information must then be based on a specific chemical shift for the first spin type, which is provided by a reference spin type of the second spin types. Since the chemical shifts between the various second spin types are also known, an item of distribution information for second spin types other than the reference spin type can also be generated by a corresponding spectral shift, wherein a relative frequency is taken into account among the second spin types.

In another embodiment of the present invention, items of distribution information for the various second spin types are derived by weighting the item of reference information with a relative frequency, and by making a spectral shift by the chemical shift relative to the reference spin type. For establishing an item of distribution information for the entirety of the second spin types, the items of distribution information for the various second spin types are summed. The relative frequencies can be established as a function of an item of tissue information about the acquisition volume and/or region of interest, in particular the region described by the tissue mask. In other words, a known relative frequency of establishing individual items of distribution information, or an overall item of distribution information, may be used as the basis for all second spin types. An item of tissue information may be used as a prior item of information. For example, the relative frequency of spins of different second spin types may be dependent on the region of the body of a patient as the object under examination. For example, subcutaneous fat has a different composition than body fat. If it is known (and in particular also segmented) which organ is to be imaged, corresponding items of tissue information from which relative frequencies can be derived may be retrieved from an appropriate database and/or an anatomical atlas.

As mentioned, it is possible, even in the case of a number of second spin types, to use an overall item of distribution information for all second spin types by, for example, reassembling, i.e. summing, the corresponding individual items of distribution information that have been appropriately spectrally shifted and weighted with the relative frequencies, such that a correspondingly adapted histogram or a correspondingly adapted spectral distribution is obtained which can be used for all second spin types together. As indicated, such a procedure is suitable for spins of fat-bound protons.

In addition to considering a number of spectral lines of a substance, for example of fat, it is also possible to consider a number of spectral lines of different substances, for example fat and silicone, the latter with a chemical shift of about 4.5 ppm, simultaneously in corresponding items of distribution information.

In addition to the above-described method, the invention also concerns a magnetic resonance apparatus that has a control computer configured to operate a scanner in order to implement the method according to the invention. In addition to the conventional components for implementing a magnetic resonance sequence by driving appropriate components of the magnetic resonance device, the control computer may also have an establishing processor for producing or receiving the B0 map (and optionally the tissue mask and the spin type distribution map), a calculating processor for establishing the items of distribution information, and an adapting processor for optimizing and adapting the pulse sequence parameters. All explanations with regard to the method according to the invention apply analogously to the magnetic resonance apparatus according to the invention, with which the advantages which have already been stated can therefore likewise be obtained.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all of the embodiments of the method according to the invention, as described above.

The electronically readable data storage medium is preferably a non-transitory data storage medium, for example a CD-ROM.

BRIEF DESCRIPTION OF THE DRAWINGS

FIG. 1 is a flowchart of an exemplary embodiment of the method according to the invention.

FIG. 2 shows an example of a resultant spectral distribution histogram for a reference spin type.

FIG. 3 shows the relative location of histograms for different spin types.

DESCRIPTION OF THE PREFERRED EMBODIMENTS

Figure 4:
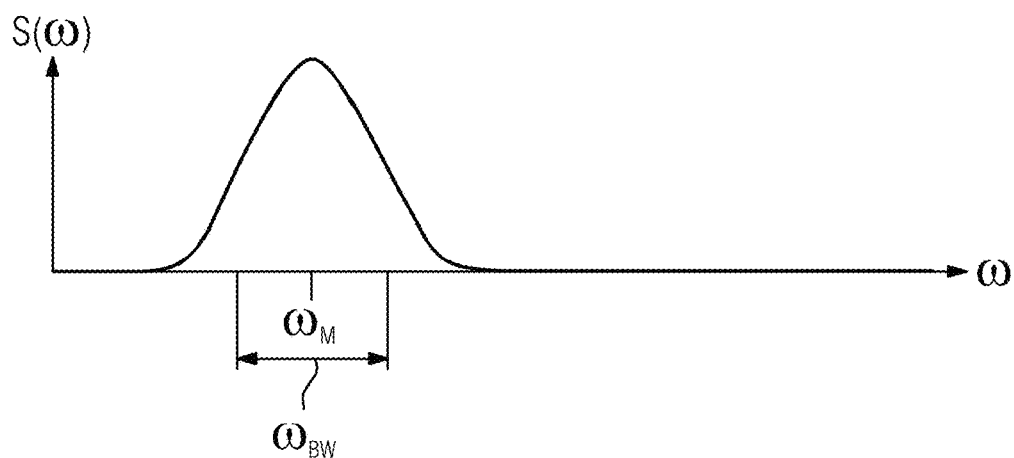
FIG. 4 shows an excitation spectrum for a first radio-frequency pulse sequence.

FIG. 1 shows a flowchart of an exemplary embodiment of the method according to the invention, which in the present case is shown with reference to spins of water-bound protons as the first spin type and spins of fat-bound protons as the second spin type. Imaging is here intended to proceed such that the signal components of the water spins are clearly recognizable but the signal components of the fat spins are suppressed as far as possible.

Step S1 involves establishing basic items of information to be used for subsequent adaptation of pulse sequence parameters of a radio-frequency pulse sequence which comprises at least one radio-frequency pulse and results in spectrally selective water excitation or spectrally selective fat suppression. These basic items of information in any event comprise a B0 field map of the acquisition volume to be acquired of an object under examination, in particular a patient, in which both excitable water spins and excitable fat spins are present. The B0 map is here based on a reference binding state of the protons (hydrogen nuclei), in the present case on the binding state of protons in water molecules. In the present exemplary embodiment, the map contains absolute values of Larmor frequencies which the water spins would have in the corresponding voxels due to the main field distribution. Optionally, but preferably, a spin type distribution map $G(x,y,z)$ may also be determined in step S1, in particular together with the B0 map $B0(x,y,z)$, which spin type distribution map may also be understood in the present exemplary embodiment as a tissue assignment map in the differentiation of water spins and fat spins. The spin type distribution map may here either provide a substantially binary indication whether water spins or fat spins predominate in a specific voxel, or it is also conceivable for the spin type distribution map to describe relative proportions of the respective spin types in the respective voxel. Various resultant further steps of the method according to the invention are addressed in greater detail below. The B0 map and the spin type distribution map are preferably determined together in a method as is described in DE 10 2014 201 207 A1.

In addition to the B0 map and optionally the spin type distribution map, the present exemplary embodiment also includes determining a tissue mask $M(x,y,z)$ which essentially describes the relevance of sub-regions or individual voxels in the acquisition volume to the imaging objective. In one simple embodiment, the tissue mask may differentiate between "relevant" and "irrelevant", for example between "tissue" (i.e. proportions of the object under examination) and "surroundings" (noise-producing air) or "region of interest" and "region not of interest". This makes it possible in the first example solely to make use of voxels which are located within the object under examination and may also contain fat spins and water spins in the following calculations. The tissue mask may also contain a continuous weighting, for example in the range from 0 (unimportant region) to 1 (important region) for each voxel, such that, for example, an organ constituting an imaging objective which is required in high image quality may be characterized as extremely important, while surrounding tissue may be assigned a lower importance (serving only for anatomical orientation) and voxels located outside the object under examination can be assigned a value of zero. It should be noted that, if the B0 map covers a region larger than the acquisition volume, the tissue mask in any event still continues to restrict the following evaluations to the acquisition volume, optionally as has been described.

It should additionally be noted that the term "acquisition volume" may refer to region from which MR data are acquired in the current measurement procedure, thus a slice or a slab. A number of measuring operations of individual acquisition volumes (=sub-volumes) would then in this case be carried out to capture an overall volume which is to be covered. This means that, in the event of a corresponding restriction to the current acquisition volume in the subsequent course of the method, individual items of distribution information, in particular histograms, are obtained for the sub-volumes, which then results in an individual optimization of the excitation/suppression module for these sub-volumes, for example slices or slabs.

The tissue mask may be determined automatically and/or by a user entry, for example by automatic segmentation of organs and/or of the object under examination in the B0 map itself and/or a previously acquired magnetic resonance data set, such as a localizer. It is also possible for a user to mark relevant regions and/or the relevance thereof, for example in a display of the examination volume.

In a step S2, items of distribution information in the form of respective spectral histograms are then generated for the fat spins and the water spins. The histograms here indicate how frequently which Larmor frequencies occur in the relevant proportion of the acquisition volume defined on the basis of the tissue mask. There are here a number of alternative options for establishing the items of distribution information, which will be described in greater detail below. As already mentioned, when acquiring a number of sub-volumes, for example slices, the acquisition volumes and preferably also the items of distribution information relate to these sub-volumes.

Ideally, thus in the case of a perfectly uniform main magnetic field and in the sole presence of fat spins which also resonate at the chemical shift which defines the second spin type, water or fat resonance histograms would consist of precisely one line at the respective Larmor frequencies $\omega w$ or $\omega w (1+CS)$, wherein CS denotes the relative chemical shift between fat spins and water spins and can thus for example be defined as $-3.3 \times 10^{-6}$, since there is an appreciable peak in fat resonance at this value. On the basis of the spatial distributions $B0(x,y,z)$ and $M(x,y,z)$, which were of course established in step S1, it is possible in a first variant embodiment of step S2 firstly to generate a histogram $R(\omega)$ with a defined increment Δω which indicates how frequently (or with what relevance) a Larmor frequency is to be found in the tissue in the range [ω,ω+Δω]. This means $$R(\omega)=\int dV\, M(x,y,z)\mathrm{rect}((\omega-\gamma B0(x,y,z))/\Delta\omega)$$

with the rectangular function rect(x)=1, if |x|<1/2 and rect(x)=0 otherwise.

In this first variant, a relatively uniform distribution of water spins and fat spins over the acquisition volume or the relevant region of interest is assumed, i.e. it is assumed that fat and water signals can be obtained from each of the voxels counted for the histogram R(ω). Since, however, the B0 map is based on the binding state in water molecules, the initially established resonance histogram R(ω) also corresponds to the desired item of distribution information for the first spin type, thus water spins, i.e. the water resonance histogram W(ω)=R(ω). An example result for the resonance histogram R(ω) is shown by curve 1 in FIG. 2. Moreover, distribution functions as an item of distribution information can also be derived from such curves by smoothing.

Since, however, the relative chemical shift between water spins and fat spins is known, the fat resonance histogram can also easily be determined by F(ω)=R(ω−ωcs) as an item of distribution information for fat spins. FIG. 3 shows the result, in which curve 2 indicates the water resonance histogram and curve 3 the fat resonance histogram.

If a spin type distribution map G(x,y,z) is available, there are further variant embodiments of step S2 that provide more accurate determination of the Larmor frequency distributions to be expected in the acquisition volume or the relevant proportions thereof defined by the tissue mask. In a second variant embodiment, the tissue mask G(x,y,z) may merely indicate the dominant spin type in a voxel, i.e. the spin type distribution map contains "W" for dominant water spins and "F" for dominant fat spins for each voxel. A water mask $M_W(x,y,z)=M(x,y,z)$, if G(x,y,z)="W", otherwise 0, and a fat mask $M_F(x,y,z)=M(x,y,z)$ if G(x,y,z)="F", otherwise 0, may thus firstly be determined. The histograms corresponding to the above formula are then obtained therefrom, wherein, instead of the as yet non-differentiating mask M, the appropriate derived masks $M_w$ and $M_F$ are used to obtain the respective W and F resonance histograms.

A still more accurate estimate of the Larmor frequency distributions to be expected, and thus of the items of distribution information, is obtained if the spin type distribution map G(x,y,z) contains relative proportions of water and of fat for each voxel. In this third variant of step S2, it is then possible to use fat and water threshold value assignments $GS_W(x,y,z)$ or $GS_F(x,y,z)$ which assume a value of 1 if the proportions of water or of fat are above a predetermined threshold value and otherwise a value of 0. $M_{w/F}(x,y,z)=M(x,y,z)\,GS_{W/F}(x,y,z)$ and the resonance histograms as already described above with regard to the second variant are then obtained. In this manner, contributions from precisely those spatial positions which contain virtually no water (fat) can be excluded from the water (fat) resonance histogram.

Overall, using a spin type distribution map G in the second and third variants permits the generation of spectral resonance histograms F(ω) and W(ω) for fat and water which more correctly reproduce the distributions of the Larmor frequencies of the respective spin types which actually prevail in the object under examination than if for example the theoretical fat spectrum F(ω) were merely generated from the known water spectrum W(ω)=R(ω) by adding the chemical shift, cf. the first variant. In the optimization method which will now be discussed, better use can then be made of the degrees of freedom in order to achieve more effective saturation or excitation of the fat or water protons which are actually present.

In a step S3, adapted pulse sequence parameters are then established in a optimization method which makes use of the items of distribution information (F(ω), W(ω)).

It should additionally be noted that it is also possible to take account of a number of fat spectral lines for the purposes of the present invention, therefore ultimately a number of second spin types each with assigned chemical shifts. This is because there is conventionally not just one specific binding state in fat to which a fixed Larmor frequency might be assigned, but there are instead different binding states in fat which may occur with different relative frequencies depending on the region of the body. If these relative frequencies are known, for example as an item of tissue information that can be retrieved from a database and/or an anatomical atlas as a function of an item of capture information that describes the acquisition volume or the region of interest, this knowledge can be used to estimate the fat resonance histogram F(ω) still more accurately. To this end, items of distribution information based on individual fat binding states are generated in that, for each further fat binding state to be considered, the initially available fat resonance histogram for a specific fat binding state as reference spin type is scaled by the relative frequency of the further fat binding state and shifted by the corresponding chemical shift relative to the reference spin type. The resultant sub-items of distribution information can then be re-summed to obtain a new item of distribution information F(ω) that takes account of the distribution of sub-resonances in the fat tissue for all of these fat-binding states.

A spectral excitation or saturation which is as far as possible restricted to one spin type may be stated as an optimization problem, in particular dependent on constraints. Pulse sequence parameters which determine the shape and/or location of the excitation spectrum S(ω) which is assigned to the radio-frequency pulse sequence here serve as optimization parameters. It is thus possible to specify the shape of the excitation spectrum and only to optimize the location, but it is preferable to parameterize the shape and likewise take it into account during optimization.

In this exemplary embodiment, in the case of spectrally selective water excitation by the radio-frequency pulse sequence, the location of the excitation spectrum of the radio-frequency pulse sequence may be determined such that the fat signal is minimized as the quality criterion, wherein retention of at least 95% of the water signals may simultaneously be used as a constraint. Stated in formulae, this means that the target function $\int d\omega F(\omega)(1-S(\omega))$ is minimized, wherein $\int d\omega W(\omega)>0.95\int d\omega W(\omega)$ should apply as a constraint (boundary condition). A corresponding optimization procedure may also be used for a fat-suppressing radio-frequency pulse sequence.

If, for example, a Gaussian radio-frequency pulse with bandwidth $\omega_{BW}$ and center frequency $\omega_M$ is used for fat suppression, the excitation spectrum has the shape $S(\omega)=(w\omega_{BW}\sqrt{2\pi})^{-1}\exp(-1/2(\omega-\omega_M)^2)$. Such an excitation spectrum (here: saturation spectrum) is shown as an example in FIG. 4. Location $(\omega_M)$ and/or shape $(\omega_{BW})$ may here be considered as pulse sequence parameters to be optimized.

Figure 5:
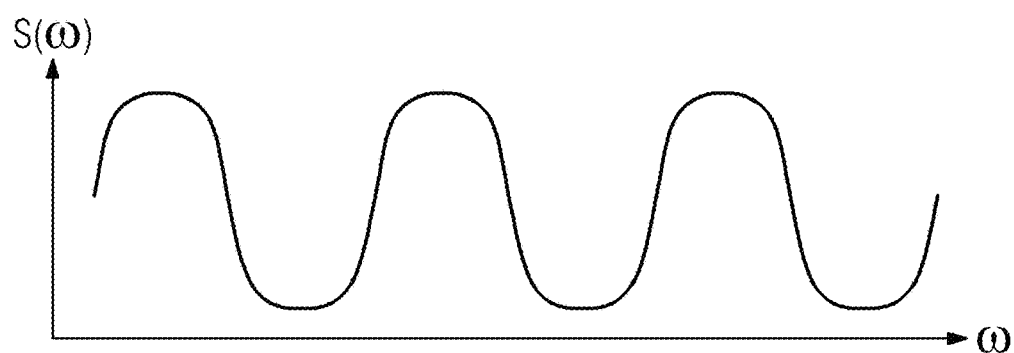
FIG. 5 shows an excitation spectrum for a second radio-frequency pulse sequence.

If, for example, a 1-2-1 binomial pulse comprising three radio-frequency pulses is used as the radio-frequency pulse sequence for water excitation, the resultant excitation spectrum S(ω) is shown by way of example in FIG. 5. The temporal spacing and relative phase of the individual radio-frequency pulses, which lead to the spectral shape being shifted or stretched, may here be considered as pulse shape parameters to be optimized.

In a step S4, cf. again FIG. 1, the pulse sequence parameters obtained as a result of the optimization method in step S3 are then correspondingly used to implement the magnetic resonance sequence and to obtain corresponding high quality magnetic resonance data of the examination volume.

Figure 6:
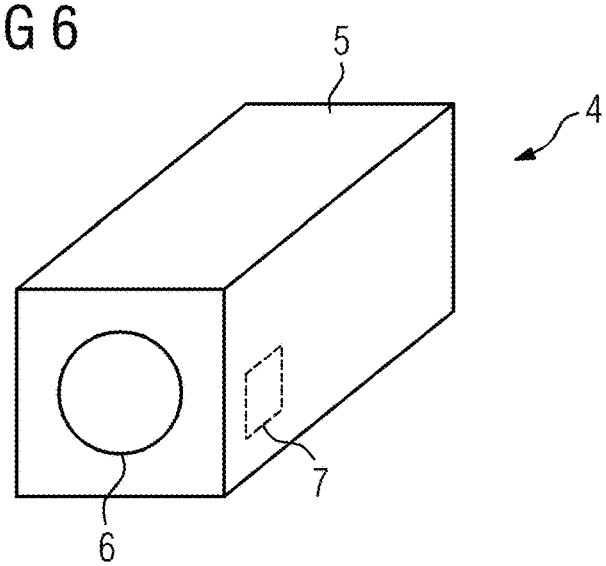
FIG. 6 shows a magnetic resonance device according to the invention.

FIG. 6 finally shows a schematic diagram of a magnetic resonance apparatus 4 according to the invention. The magnetic resonance apparatus 4 has, as is known in principle, a scanner 5, which contains the basic field magnet that generates the basic field, and defines a patient accommodation space 6, into which a patient to be accommodated as the object under examination may be introduced by a patient support (not shown). Operation of the magnetic resonance apparatus 4 is controlled by a control computer 7, which is also configured to carry out the method according to the invention.

To this end, the control computer 7, in addition to at least one sequence controller configured to operate further components of the magnetic resonance apparatus 4 for radiating the radio-frequency pulse sequence, also has an establishing processor that for establishes the B0 map, the tissue mask and the spin type distribution map, a calculating processor that establishes the items of distribution information, and an adapting processor that for identifies and sets optimized pulse sequence parameters.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data, comprising:
   placing an object in MR data acquisition scanner, said object comprising a volume containing a first excitable nuclear spin type and a second excitable nuclear spin type, each of said first and second excitable spin types having a respective Larmor frequency, and the respective Larmor frequencies differing by a chemical shift, said MR data acquisition scanner having a basic magnetic field (B0) therein in which said volume is situated;
   in a computer, obtaining a B0 map that describes a distribution of said basic magnetic field at least in a region of interest within said volume;
   in said computer, deriving, from said B0 map, a first item of distribution information that describes a spectral distribution of Larmor frequencies that indicates how frequently a Larmor frequency of the first spin type that is associated with the object is found within a frequency range, and a second item of distribution information that describes a spatial distribution of Larmor frequencies that indicates how frequently a Larmor frequency of the second spin type that is associated with the object is found within the frequency range;
   in said computer, for a radio-frequency (RF) pulse sequence that will be radiated in said MR data acquisition scanner in order to (i) selectively excite magnetic resonance signals of said first spin type and not excite magnetic resonance signals of said second spin type, or (ii) selectively suppress magnetic resonance signals of said second spin type and not suppress magnetic resonance signals of said first spin type, and optimize, based on said first and second items of distribution information, at least one pulse sequence parameter that describes an excitation spectrum of said RF pulse sequence, with regard to at least one quality criterion that optimizes at least one of the selective excitation or suppression, and thereby producing an optimized RF pulse sequence; and
   from said computer, producing and emitting, in electronic form, a control sequence, which includes said optimized RF pulse sequence, in a format for operating said MR data acquisition scanner in order to acquire MR data from said region of interest.

2. A method as claimed in claim 1 comprising, in said computer, using at least one extremization criterion as said at least one quality criterion, said at least one extremization criterion being at least one of a minimum excitation or suppression of the respective first and second spin types, and a maximum excitation or suppression of the respective first and second spin types.

3. A method as claimed in claim 1 comprising, in said computer, using, as said at least one quality criterion, extremization criteria with respective weightings, which describe a maximum excitation or suppression of the respective first and second spin types, and a minimum excitation or suppression of the respective first and second spin types.

4. A method as claimed in claim 1 comprising, in said computer, using at least one constraint as said at least one quality criterion, said at least one constraint including at least one of a maximum permitted excitation or suppression of the respective first and second spin types, and a minimum desired excitation or suppression of the respective first and second spin types.

5. A method as claimed in claim 1 comprising producing said first item of distribution information as a first histogram and producing said second item of distribution information as a second histogram.

6. A method as claimed in claim 1 comprising, in said computer, producing one of said first or second items of distribution information for one of said first or second spin types by shifting the distribution of the Larmor frequencies of the other of said first or second spin types by the chemical shift.

7. A method as claimed in claim 6 comprising producing said B0 map based on said other of said first or second spin types, as a reference spin type.

8. A method as claimed in claim 1, wherein said B0 map is comprised of voxels, and wherein said method further comprises, in said computer, producing a spin type distribution map that assigns spin type proportions to respective voxels in said spin type distribution map, at least in said region of interest, and using said B0 map to derive said first and second items of distribution information with a contribution of each voxel of said B0 map to said first and second items of distribution information being dependent on a spin type proportion in a corresponding voxel of said spin type distribution map.

9. A method as claimed in claim 8 comprising producing said spin type distribution map so as to describe a dominant spin type for each voxel.

10. A method as claimed in claim 8 comprising producing said spin type distribution map so as to describe relative proportions of the respective first and second spin types in each voxel.

11. A method as claimed in claim 10 comprising using a voxel of said B0 map to contribute to deriving said first and second items of distribution information only when a relative proportion of the respective first and second spin types in the corresponding voxel of said spin type distribution map exceeds a threshold value.

12. A method as claimed in claim 1 wherein said object is a patient comprising tissue, wherein said B0 map is comprised of voxels, and wherein said method further comprises producing a tissue mask in said computer that designates, for each voxel of said tissue map, whether or how strongly a corresponding voxel of said B0 distribution map should be used when deriving said first and second items of distribution information.

13. A method as claimed in claim 12 comprising producing said tissue mask in said computer by a procedure including at least one of automatic production of said tissue map, production of said tissue map in response to a user entry, production of said tissue map by segmentation of boundaries of said object, production of said tissue map by segmentation of an organ in said B0 map, and production of said tissue map by segmentation of the object or an organ in previously acquired MR data from the object.

14. A method as claimed in claim 1, wherein said volume of said object comprises a plurality of further second spin types, deriving a second item of distribution information respectively for each of said plurality of further second spin types, and optimizing said at least one pulse sequence parameter based on said first item of distribution information and said plurality of further second items of distribution information.

15. A method as claimed in claim 14 comprising deriving a single second spin type distribution from each of the plurality of second spin type distributions, based on reference information established from the B0 map based on reference spin type.

16. A method as claimed in claim 15 comprising deriving said plurality of further second items of distribution information by weighting the reference information with a relative frequency and making a spectral shift of the chemical shift relative to the reference spin type.

17. A method as claimed in claim 16 comprising deriving the further second items of distribution information for the respective further spin types by re-summing.

18. A method as claimed in claim 16 comprising deriving said plurality of further second items of distribution information by establishing the relative frequencies dependent on an item of tissue information with respect to said volume or said region of interest.

19. A magnetic resonance (MR) imaging apparatus comprising:
an MR data acquisition scanner in which an object is placed for examination, said object comprising a volume containing a first excitable nuclear spin type and a second excitable nuclear spin type, each of said first and second excitable spin types having a respective Larmor frequency, and the respective Larmor frequencies differing by a chemical shift, said MR data acquisition scanner having a basic magnetic field (B0) therein in which said volume is situated;
a computer configured to obtain B0 map that describes a distribution of said basic magnetic field at least in a region of interest within said volume;
said computer being configured to derive, from said B0 map, a first item of distribution information that describes a spectral distribution of Larmor frequencies that indicates how frequently a Larmor frequency of the first spin type that is associated with the object is found within a frequency range, and a second item of distribution information that describes a spatial distribution of Larmor frequencies that indicates how frequently a Larmor frequency of the second spin type that is associated with the object is found within the frequency range;
said computer being configured, for a radio-frequency (RF) pulse sequence that will be radiated in said MR data acquisition scanner in order to (i) selectively excite magnetic resonance signals of said first spin type and not excite magnetic resonance signals of said second spin type, or (ii) selectively suppress magnetic resonance signals of said second spin type and not suppress magnetic resonance signals of said first spin type, and to optimize, based on said first and second items of distribution information, at least one pulse sequence parameter that describes an excitation spectrum of said RF pulse sequence, with regard to at least one quality criterion that optimizes at least one of the selective excitation or suppression, and thereby producing an optimized RF pulse sequence; and
said computer being configured to produce and emit, in electronic form, a control sequence, which includes said optimized RF pulse sequence, in a format for operating said MR data acquisition scanner in order to acquire MR data from said region of interest.

20. A non-transitory, computer-readable data storage medium encoded with programming instructions, said storage medium being loaded into a computer system of a magnetic resonance (MR) apparatus, comprising an MR data acquisition scanner in which an object is placed for examination, said object comprising a volume containing a first excitable nuclear spin type and a second excitable nuclear spin type, each of said first and second excitable spin types having a respective Larmor frequency, and the respective Larmor frequencies differing by a chemical shift, said MR data acquisition scanner having a basic magnetic field (B0) therein in which said volume is situated, said programming instructions causing said computer system to:
obtain a B0 map that describes a distribution of said basic magnetic field at least in a region of interest within said volume;
derive, from said B0 map, deriving a first item of distribution information that describes a spectral distribution of Larmor frequencies that indicates how frequently a Larmor frequency of the first spin type that is associated with the object is found within a frequency range, and a second item of distribution information that describes a spatial distribution of Larmor frequencies that indicates how frequently a Larmor frequency of the second spin type that is associated with the object is found within the frequency range;
for a radio-frequency (RF) pulse sequence that will be radiated in said MR data acquisition scanner in order to (i) selectively excite magnetic resonance signals of said first spin type and not excite magnetic resonance signals of said second spin type, or (ii) selectively suppress magnetic resonance signals of said second spin type and not suppress magnetic resonance signals of said first spin type, and optimize, based on said first and second items of distribution information, at least one pulse sequence parameter that describes an excitation spectrum of said RF pulse sequence, with regard to at least one quality criterion that optimizes at least one of the selective excitation or suppression, and thereby producing an optimized RF pulse sequence; and
produce and emit, in electronic form, a control sequence, which includes said optimized RF pulse sequence, in a format for operating said MR data acquisition scanner in order to acquire MR data from said region of interest.

* * * * *